United States Patent [19]

Usui et al.

[11] Patent Number: 4,788,834
[45] Date of Patent: Dec. 6, 1988

[54] METHOD AND SYSTEM FOR CONTROLLING MAGNETIC FIELD GENERATING UNIT IN MAGNETIC RESONANCE IMAGING APPARATUS

[75] Inventors: Yoshiyuki Usui, Kuroiso; Koji Kitamura, Tochigi, both of Japan

[73] Assignee: Kabushiki Kaisha Toshiba, Kawasaki, Japan

[21] Appl. No.: 119,066

[22] Filed: Nov. 10, 1987

[30] Foreign Application Priority Data

Nov. 11, 1986 [JP] Japan .................................. 61-266561
May 7, 1987 [JP] Japan .................................. 62-111839

[51] Int. Cl.⁴ ............................................. F25B 19/00
[52] U.S. Cl. .................................. 62/514 R; 62/223; 62/230; 324/318; 335/216; 335/217
[58] Field of Search ............... 62/514 R, 230, 222, 62/223; 324/318, 319, 320; 335/216, 217, 300

[56] References Cited

U.S. PATENT DOCUMENTS

| 3,022,641 | 2/1962 | Myck et al. ........................... 62/230 |
| 3,434,299 | 3/1969 | Nussbaum ............................. 62/222 |
| 3,803,864 | 4/1974 | Cooper .................................. 62/223 |
| 4,590,428 | 5/1986 | Muller et al. ........................ 324/320 |
| 4,595,899 | 6/1986 | Smith et al. .......................... 335/216 |
| 4,652,824 | 3/1987 | Oppelt .................................. 324/318 |
| 4,658,593 | 4/1987 | Stenvinkel ............................ 62/230 |

Primary Examiner—Ronald C. Capossela
Attorney, Agent, or Firm—Foley & Lardner, Schwartz, Jeffery, Schwaab, Mack, Blumenthal & Evans

[57] ABSTRACT

To reduce the running cost of an MRI apparatus, power supplied to a normal conductive coil from a pre-regulator is reduced in an idling mode. This reduction in power also reduces the heat generated in the normal conductive coil and a shunt resistor. A computer controls a cooling unit according to the amount of the heat reduced in order to reduce to flow rate of a cooling medium. In this manner, the temperatures of the normal conductive coil and shunt resistor can be maintained at constant levels. Further, if a current value is set to maintain the temperatures of the normal conductive coil and shunt resistor at the constant levels only by natural heat radiating, circulation of the cooling medium can be stopped.

12 Claims, 6 Drawing Sheets

METHOD AND SYSTEM FOR CONTROLLING MAGNETIC FIELD GENERATING UNIT IN MAGNETIC RESONANCE IMAGING APPARATUS

BACKGROUND OF THE INVENTION

The present invention relates to a magnetic resonance imaging (MRI) apparatus which provides a magnetic resonance image of a subject under examination, and more particularly to, a method for controlling a magnetic field generating unit by using means for controlling a static magnetic field power source and a cooling unit, and also to a system for executing this method.

Since an MRI apparatus needs a time-stable magnetic field, i.e., a static magnetic field, a constant current power source is used in a normal conductive MRI apparatus to apply a time-stable current to a normal conductive coil.

The intensity of a static magnetic field generally depends on the stability of the output voltage of a static magnetic field power source and also on the stability of the shape of the normal conductive coil. These stabilities may be deteriorated by a change in temperature. Various methods for controlling the temperature are employed to stabilize the intensity of a static magnetic field. With regarded to the static magnetic field power source, (1) parts receiving less influence of a temperature change are used, (2) essential parts are disposed under temperature-controlled conditions, or (3) the power source is set under temperature-controlled conditions. With regard to the normal conductive coil, (1) the temperature of a medium such as cooling water for cooling the normal conductive coil is controlled or (2) the normal conductive coil is set under temperature-controlled conditions.

Figure 1:
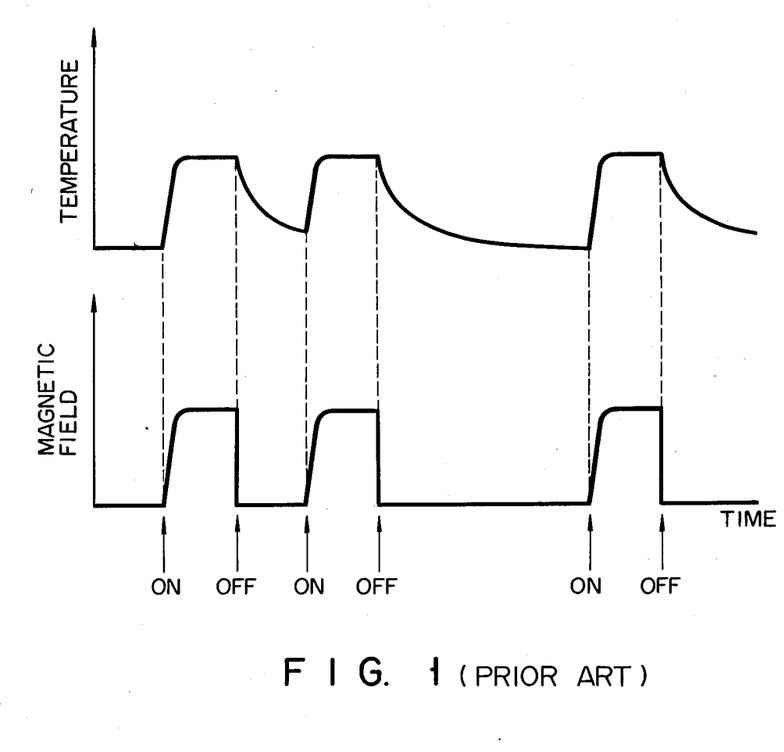
FIG. 1 is a graph illustrating a change in a magnetic field in turned on and turned off states of a static magnetic field power source in a conventional MRI apparatus and a change in a temperature within the MRI apparatus.

Once the static magnetic field power source is turned off, the power consumed by the parts such as a shunt resistor and a normal conductive coil, which can influence the stability of a static magnetic field, becomes zero, thus reducing the temperature. When the static magnetic field power source is energized again, it would take a long time to put the temperature of these parts in a stable state again. This time is called "preheating time." As shown in FIG. 1, the intensity of a static magnetic field varies within that time, so that no scanning by an MRI apparatus is possible during the time.

According to prior art, therefore, even when the MRI does not carry out a scanning operation while, for example, the patient is being moved, the static magnetic field power source is energized to provide a stable static magnetic field. However, this method requires more power, thereby the running cost of the MRI apparatus is increased and the life of the apparatus is shorten.

Under the circumstances, it is required a control method which can stabilize the static magnetic field generated in an MRI apparatus and can reduce the running cost of the apparatus as well.

SUMMARY OF THE INVENTION

Accordingly, it is an object of this invention to provide a method for controlling a magnetic field generating unit by using means for controlling a static magnetic field power source, and a cooling unit in a magnetic resonance imaging apparatus and also to a system for executing the method.

According to this invention, there is provided a method for controlling a magnetic field generating unit provided in a magnetic resonance imaging apparatus, comprising the steps of:

inputting selectively a signal to specify one of a scanning mode and an idling mode in the magnetic resonance imaging apparatus;

supplying a power to a normal conductive coil for generating a static magnetic field in the scanning mode;

detecting temperatures of a shunt resistor and the normal conductive coil that are heated by the supplied power;

controlling the temperatures of the normal conductive coil and the shunt resistor by operating a flow rate of a cooling medium in accordance with the detected temperatures;

reducing the power supplied to the normal conductive coil in the idling mode;

detecting temperatures of the normal conductive coil and the shunt resistor due to reduction in the power; and controlling the temperatures of the normal conductive coil and the shunt resistor by operating the flow rate of the cooling medium in accordance with the detected temperatures.

According to this invention, there is also provided a system for controlling a magnetic field generating unit provided in a magnetic resonance imaging apparatus, comprising:

means for inputting selectively a signal to specify one of a scanning mode and an idling mode of the magnetic resonance imaging apparatus;

means for supplying a power to a normal conductive coil for generating a static magnetic field in the scanning mode;

means for detecting temperatures of a shunt resistor and the normal conductive coil that are heated by the supplied power;

means for controlling the temperatures of the normal conductive coil and the shunt resistor by operating a flow rate of a cooling medium in accordance with the detected temperatures;

means for reducing the power supplied to the normal conductive coil in the idling mode;

means for detecting temperatures of the normal conductive coil and the shunt resistor due to reduction in the power; and means for controlling the temperatures of the normal conductive coil and the shunt resistor by operating the flow rate of the cooling medium in accordance with the detected temperatures.

DETAILED DESCRIPTION OF PREFERRED EMBODIMENT

An embodiment of this invention will now be explained with reference to the accompanying drawings.

Figure 3:
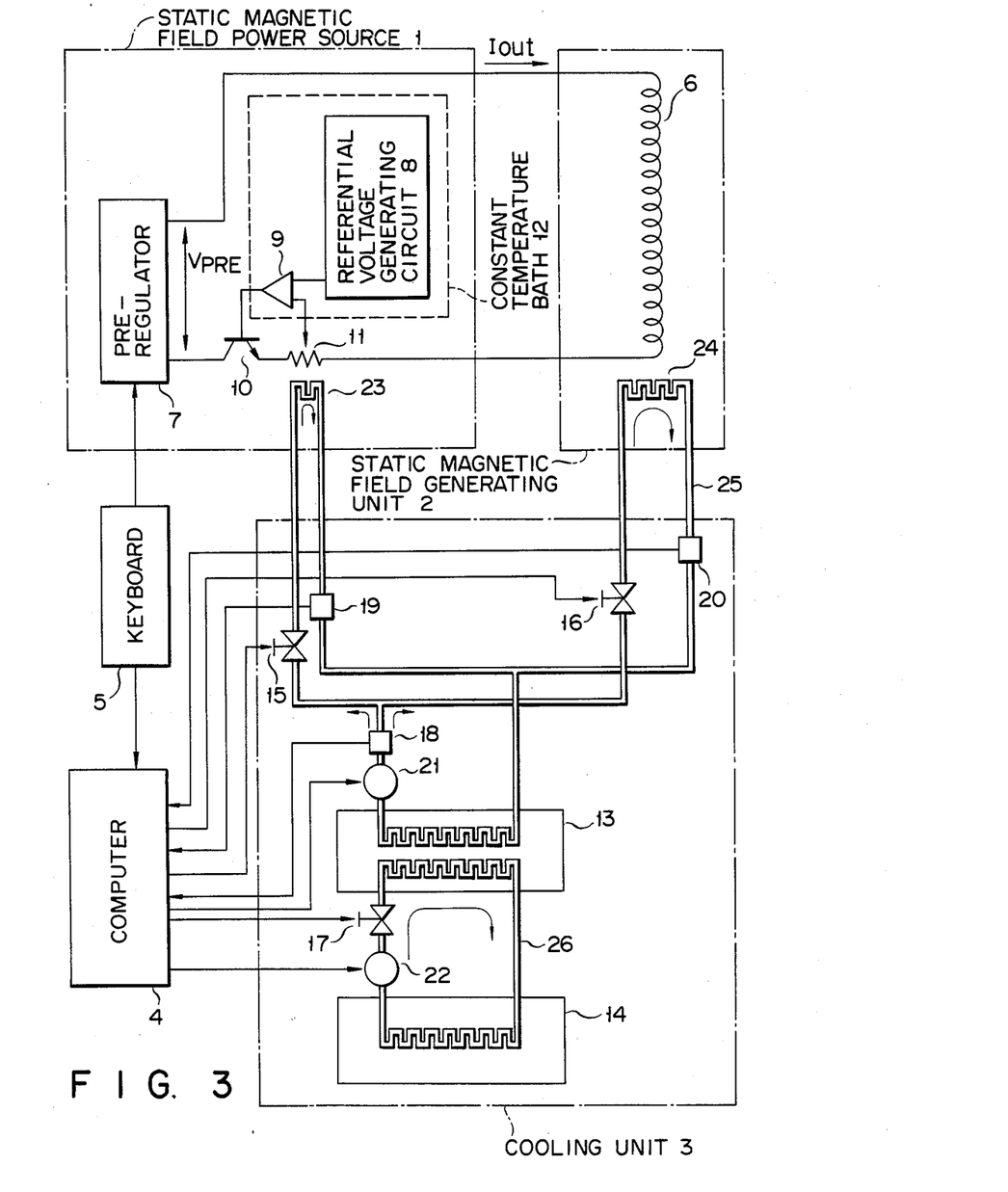
FIG. 3 is a diagram of a control system for a magnetic field generating unit in an MRI apparatus according to one embodiment of this invention.

FIG. 3 illustrates the arrangement of a control system for a magnetic field generating unit in an MRI apparatus according to one embodiment of this invention. As shown in FIG. 3, this system comprises a static magnetic field power source 1, static magnetic field generating unit 2, a cooling unit 3, a computer 4 and a keyboard 5. Static magnetic field power source 1, which supplys power to a normal conductive coil 6 in static magnetic field generating unit 2, has a pre-regulator 7, a referential voltage generating circuit 8, a differential amplifier 9, a bipolar transistor 10 used as a series control element and a shunt resistor 11.

Pre-regulator 7 varies its output voltage to normal conductive coil 6 by a signal received from keyboard 5, and is constituted by a slide regulator or a thyristor circuit, for example. This pre-regulator 7 has one output terminal coupled directly to one end of normal conductive coil 6 and the other terminal coupled to the other end of the coil 6 through bipolar transistor 10 and shunt resistor 11. Differential amplifier 9 amplifies the difference between the voltage generated in shunt resistor 11 by supplying the power to normal conductive coil 6 and the output voltage of referential voltage generating circuit 8. The output of the amplifier 9 is applied to the base of bipolar transistor 10 to drive the transistor 10. Circuit 8 and amplifier 9 are disposed in a constant temperature bath 12 for stable operation.

Cooling unit 3, which cools normal conductive coil 6 and an essential portion of static magnetic field power source 1, such as shunt resistor 11, has a heat exchanger 13, a freezer 14, an electromagnetic valves 15 to 17, temperature sensors 18 to 20 and pumps 21 and 22.

A heat exchanger 23 exchanges heat with shunt resistor 11, a heat exchanger 24 exchanges heat with normal conductive coil 6. These heat exchangers 23 and 24 are coupled to the aforementioned heat exchanger 13 via a cooling-medium flow pipe 25, for example, water is circulated through pipe 25. The flow rate of cooling water in pipe 25 can be operated by electromagnetic valves 15 and 16 and pump 21 which are under the control of computer 4. Temperature sensors 18 to 20 are respectively disposed on the cooling-water entrance and exit of heat exchanger 13. The temperature sensors 18 to 20 may each be a thermistor. The outputs of these temperature sensors are latched in computer 4. Heat exchanger 13 is further coupled to freezer 14 through a low temperature medium flow pipe 26, which is provided with electromagnetic valve 17 and pump 22 that are under the control of computer 4.

Computer 4 controls cooling unit 3 and maintains the temperatures of shunt resistor 11 and normal conductive coil 6 by reducing the amount of heat exchanged corresponding to a reduction of the consumption power in shunt resistor 11 and normal conductive coil 6 when an MRI apparatus is idling. Particularly, when the amount of heat corresponding to the reduced consumption power can be compensated by natural heat radiation, the cooling medium, e.g., cooling water, is stopped to flow.

Figure 4:
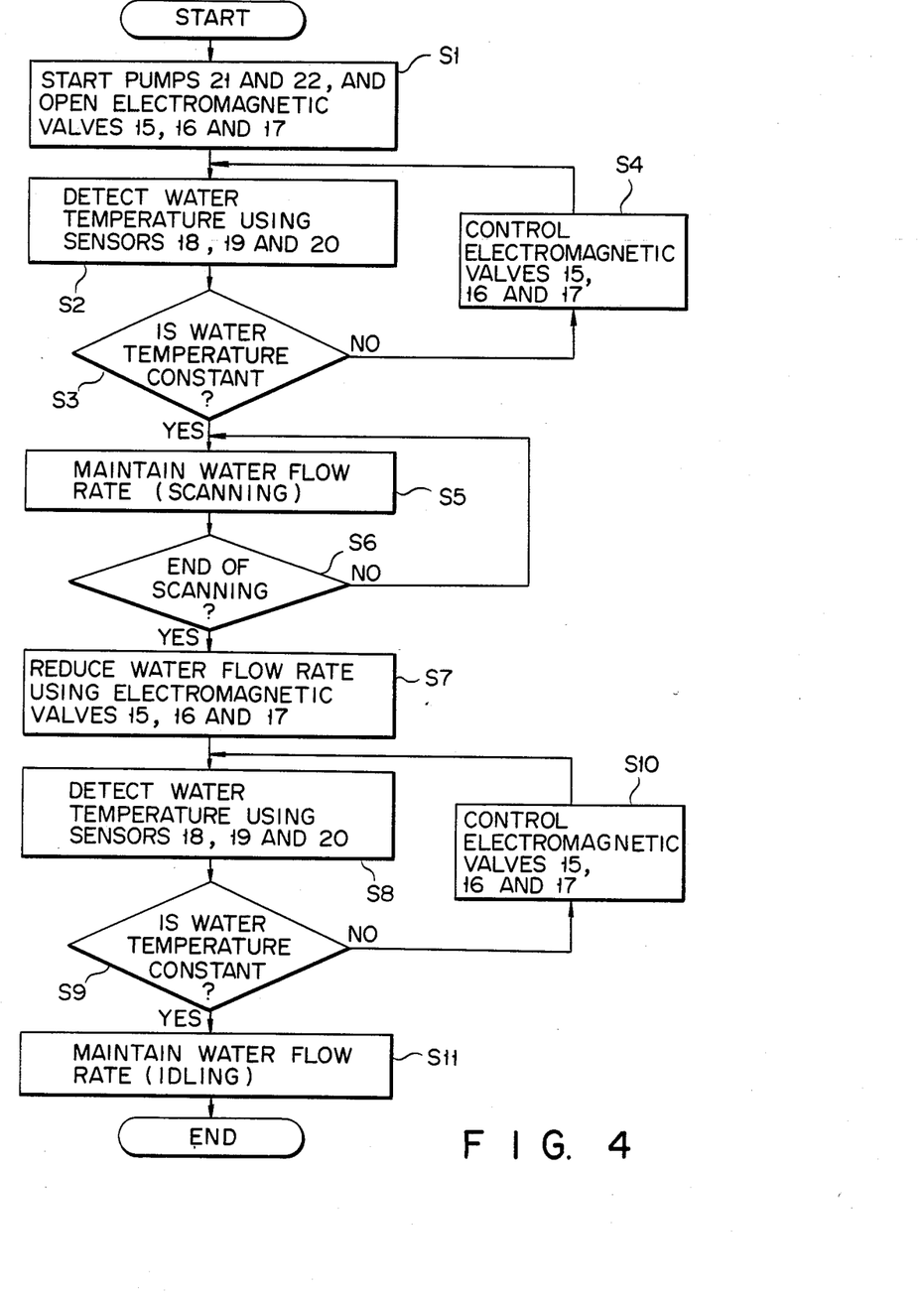
FIG. 4 is a flowchart for an operation of a cooling unit in scanning and idling modes of the MRI apparatus according to this embodiment.

The operation of the cooling unit in scanning and idling modes of the present system with the above arrangement will now be explained according to the flowchart of FIG. 4.

In step S1, pumps 21 and 22 are driven by a scanning signal inputted from keyboard 5, electromagnetic valves 15 to 17 are opened. In step S2 water temperature is detected using temperature sensors 18 to 20. In the subsequent step S3 it is determined whether or not the detected temperature is constantly at a predetermined temperature. If the detected temperature is not constant, the flow rate of water is controlled by operating the electromagnetic valves 15 to 17 (step S4). This operation is repeated until the detected temperature becomes constant.

If the detected temperature is constant in step S3, the flow rate of the cooling water is maintained (step S5). This is the scanning state in the MRI apparatus.

In step S6 it is examined whether or not a scanning operation is completed. Actually, it is checked that whether or not an idling command signal is inputted from keyboard 5. When the idling command signal is inputted, current flowing across normal conductive coil 6 is reduced so that the flow rate of the cooling water is reduced using electromagnetic valves 15 to 17 in accordance with the amount of a coil current $I_{out}$ reduced (step S7).

In step S8 water temperature is detected again using temperature sensors 18 to 20, and in step S9 it is examined whether or not the detected temperature is constant at the predetermined temperature. When the detected temperature is not constant, the flow rate of the cooling water is controlled using electromagnetic valves 15 to 17 (step S10). This operation is repeated until the detected temperature becomes constant.

If the detected temperature is constant in step S9, the flow rate of the cooling water is maintained (step S11). This is the idling state in the MRI apparatus.

When the mode is changed from the scanning mode to the idling mode, pumps 21 and 22 can be stopped if the amount of heat generated in the normal conductive coil 6 and the shunt resistor 11 by a pre-set current value becomes equal to the amount of naturally-radiated heat and each detected temperature is maintained constant.

Through the above operation, the running cost in the idling mode can be reduced.

The operation of the present system will now be explained.

Figure 2:
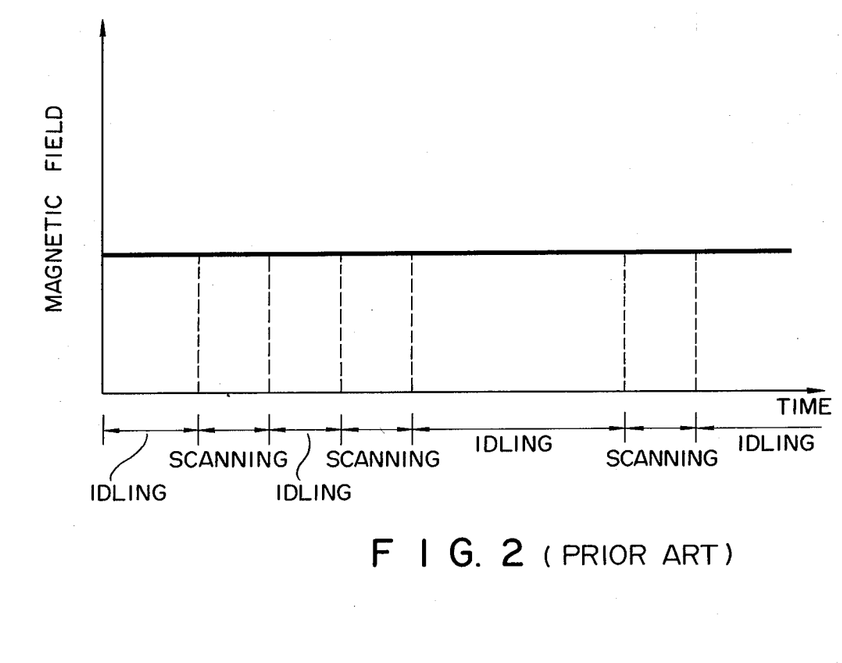
FIG. 2 is a graph illustrating a change in a magnetic field when an MRI apparatus is operated by a conventional method.
Figure 5:
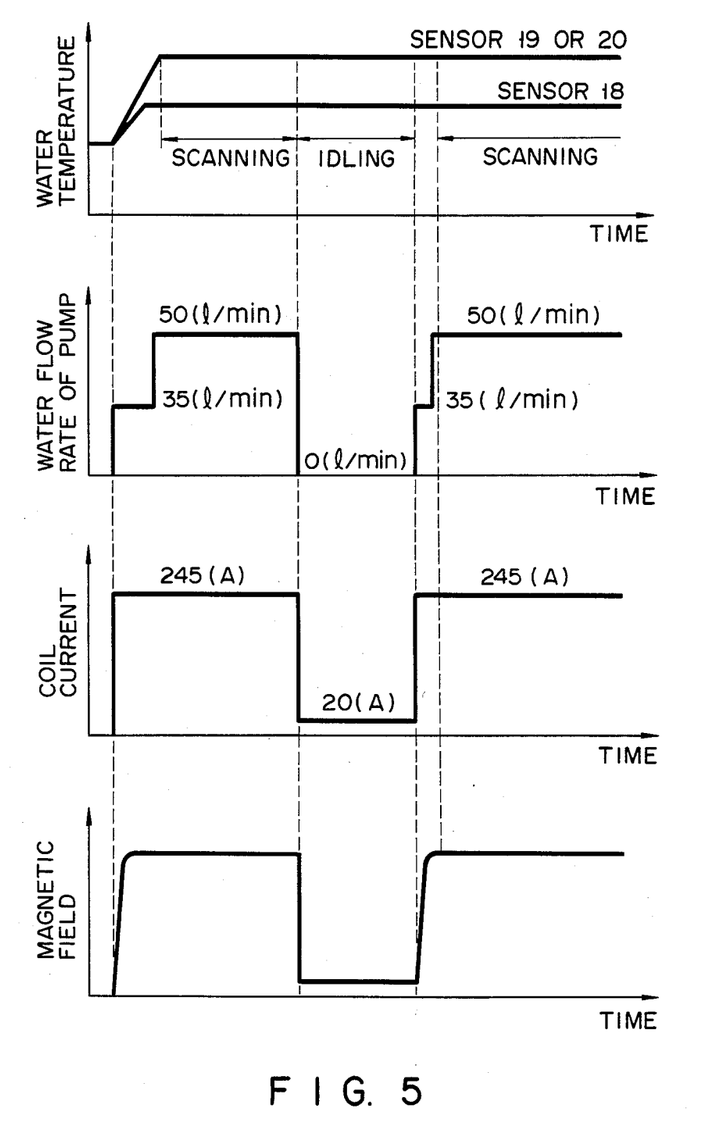
FIG. 5 is a timing chart for operation of the system according to the embodiment.

FIG. 5 illustrates an example of the operation timing chart of the present system, which has, like conventional system, a scanning mode and an idling mode as shown in FIG. 2. In the scanning mode, it is necessary to generate a uniform static magnetic field with a given intensity by normal conductive coil 6, static magnetic field power source 1 supplys a given power to the coil 6.

On the other hand, when no scanning operation is executed due to, for example, shifting of patients, the idling command signal is inputted from keyboard 5 to pre-regulator 7, which decreases output voltage $V_{PRE}$ to reduce the current flowing through normal conductive coil 6. This reduces the consumption power of shunt resistor 11 and normal conductive coil 6. Computer 4 responds to the outputs of temperature sensors 18 to 20 and drives electromagnetic valves 15 to 17, thus reducing the amount of heat exchanged in cooling unit 3. In other words, to obtain a time stable static magnetic field, it is necessary to maintain the temperatures of shunt resistor 11 and normal conductive coil 6 at constant levels. In this respect, therefore, the amount of heat exchanged by cooling unit 3 is reduced by decrease of the consumption power in the idling mode.

To maintain the temperature of shunt resistor 11 and normal conductive coil 6 in the scanning and idling modes, it is necessary to (1) maintain the temperature on the cooling-water entrance at a constant level and (2) maintain the temperature on the cooling-water exit at a constant level as well. In order to satisfy these conditions, these temperatures are detected using temperature sensors 18 to 20 and electromagnetic valves 15 to 17 are controlled according to the detected temperatures, thereby controlling the amount of heat exchanged.

If the value of the current flowing through normal conductive coil 6 in the idling mode is set in consideration of natural heat radiation, computer 4 closes electromagnetic valves 15 to 17 to stop the circulation of the cooling water in the idling mode. With the stopping of the water circulation, therefore, it is now only the natural heat radiation that contributes to radiation the heat of normal conductive coil 6. Consequently, pre-regulator 7 reduces the coil current $I_{out}$ to a level that accommodates the amount of the natural heat radiation of normal conductive coil 6.

To execute the scanning operation again, the scanning signal is inputted from keyboard 5. At this time, the output current of pre-regulator, or the coil current $I_{out}$, increases to the level required for that operation, and at the same time, computer 4 opens electromagnetic valves 15 to 17 to start the circulation of the cooling water. Based on the output of temperature sensor 18, computer 4 controls electromagnetic valve 17 so as to always maintain, at a constant level, the temperature of the cooling water flowing out from the exit of heat exchanger 13. Similarly, based on the outputs of temperature sensors 19 and 20, computer 4 controls electromagnetic valves 15 and 16 so that the temperatures of the cooling water flowing out from heat exchangers 23 and 24 become the levels for the scanning mode.

With this control operation, when the mode changes from the idling mode to the scanning mode, the temperatures of shunt resistor 11 and normal conductive coil 6 hardly change, thus generating a time-stable static magnetic field. What is more, in the idling mode the running cost of the MRI apparatus can significantly be reduced.

For instance, when the coil current is 245 A and the flow rate of the cooling water is 50 l/min in the scanning mode, the coil current and the flow rate of the cooling water in the idling mode respectively become 20 A and 0 l/min; the coil current is reduced to $\frac{1}{12}$. The consumption power would be reducted to 1/144.

The present invention is not limited to the above embodiment, and may apply to various modifications within the spirit and scope of the invention.

For instance, gas may replace water as a cooling medium.

Further, static magnetic field power source 1 and normal conductive coil 6 may each be provided with a function changing the flow rate of a cooling medium.

Figure 6A:
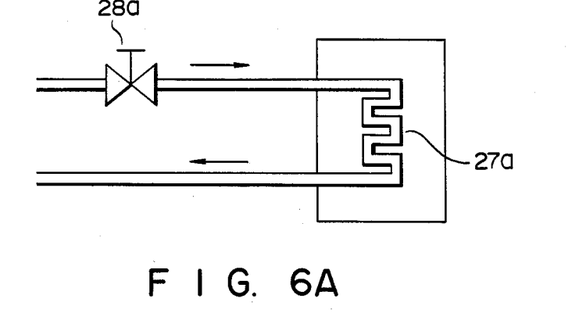
FIGS. 6A through 6C are arrangements for controlling the flow rate of a cooling medium.
Figure 6B:
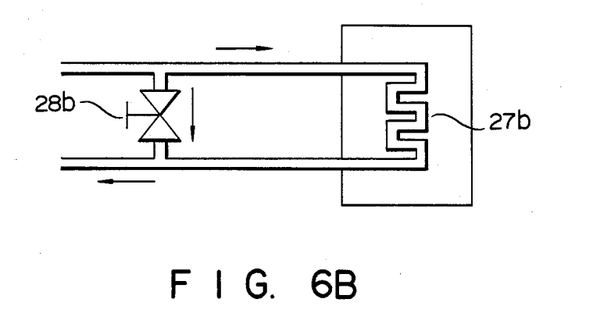
Figure 6C:
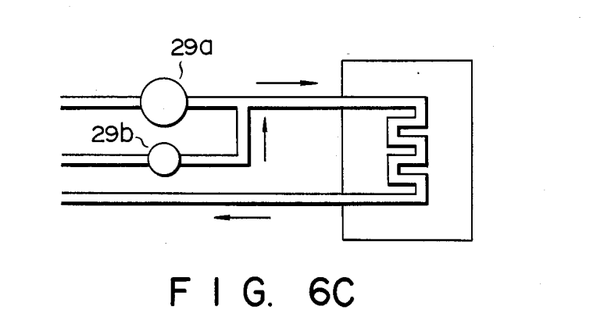

Various methods used for changing the flow rate of the cooling medium are shown in FIGS. 6A to 6C. In FIG. 6A an electromagnetic valve 28a is coupled in series to a heat exchanger 27a and this valve 28a is controlled. In FIG. 6B an electromagnetic valve 28b is coupled in parallel to a heat exchanger 27b, this valve 28b is controlled. In FIG. 6C pumps 29a and 29b are arranged in parallel to each other such that both of the pumps are driven in the scanning mode and only pump 29b is driven in the idling mode. These methods can be combined.

Furthermore, if the amount of the heat naturally radiated is reduced by the use of an adiabatic member or the like, the coil current in the idling mode can also be reduced.

In the above-described embodiment, the output of static magnetic field power source 1 is reduced by the idling signal inputted from keyboard 5. However, the same effect can be obtained by setting the reference voltage $V_{REF}$ from referential voltage generating circuit 8 at a low level.

In addition, shunt resistor 11 is cooled by heat exchanger 23, but since the amount of heat generated by this resistor 11 is small, it should not necessarily be cooled; shunt resistor 11 may be placed in constant temperature bath 12.

What is claimed is:

1. A method for controlling a magnetic field generating unit in a magnetic resonance imaging apparatus comprising the steps of:
   inputting selectively a signal to specify one of a scanning mode and an idling mode in the magnetic resonance imaging apparatus;
   supplying a power to a normal conductive coil for generating a static magnetic field in the scanning mode;
   detecting temperatures of a shunt resistor and the normal conductive coil that are heated by the supplied power;
   controlling the temperatures of the normal conductive coil and the shunt resistor by operating a flow rate of a cooling medium in accordance with the detected temperatures;
   reducing the power supplied to the normal conductive coil in the idling mode;
   detecting temperatures of the normal conductive coil and the shunt resistor due to reduction in the power; and
   controlling the temperatures of the normal conductive coil and the shunt resistor by operating the flow rate of the cooling medium in accordance with the detected temperatures.

2. The method according to claim 1, wherein a value for current flowing through the normal conductive coil in the scanning mode is set to a current value necessary to generate a magnetic field with a predetermined intensity.

3. The method according to claim 1, wherein a value for current flowing through the normal conductive coil in the idling mode is set to such a value as an amount of heat generated from the normal conductive coil equals an amount of heat naturally radiated.

4. The method according to claim 1, wherein temperatures of the normal conductive coil and the shunt resistor are detected by measuring a temperature of the cooling medium using a plurality of temperature sensors.

5. The method according to claim 1, wherein the flow rate of the cooling medium is controlled by driving at least one pump and at least one electromagnetic valve.

6. The method according to claim 1, wherein the flow rate of the cooling medium is controlled by driving only at least one pump.

7. A system for controlling a magnetic field generating unit in a magnetic resonance imaging apparatus, comprising:

means for inputting selectively a signal to specify one of a scanning mode and an idling mode in the magnetic resonance imaging apparatus;

means for supplying a power to a normal conductive coil for generating a static magnetic field in the scanning mode;

means for detecting temperatures of a shunt resistor and the normal conductive coil that are heated by the supplied power;

means for controlling the temperatures of the normal conductive coil and the shunt resistor by operating a flow rate of a cooling medium in accordance with the detected temperatures;

means for reducing the power supplied to the normal conductive coil in the idling mode;

means for detecting temperatures of the normal conductive coil and the shunt resistor due to reduction in the power; and means for controlling the temperatures of the normal conductive coil and the shunt resistor by operating the flow rate of the cooling medium in accordance with the detected temperatures.

8. The system according to claim 7, wherein a value for current flowing through the normal conductive coil in the scanning mode is obtained by means for setting a current value necessary to generate a magnetic field with a predetermined intensity.

9. The system according to claim 7, wherein a value for current flowing through the normal conductive coil in the idling mode is obtained by means for setting such a value as an amount of heat generated from the normal conductive coil equal to an amount of heat naturally radiated.

10. The system according to claim 7, wherein temperatures of the normal conductive coil and the shunt resistor are detected by means for measuring a temperature of the cooling medium using a plurality of temperature sensors.

11. The system according to claim 7, wherein the flow rate of the cooling medium is controlled by means for driving at least one pump and at least one electromagnetic valve.

12. The system according to claim 7, wherein the flow rate of the cooling medium is controlled by means for driving only at least one pump.

* * * * *